United States Patent [19]

Krishna

[11] 3,829,880

[45] Aug. 13, 1974

[54] SCHOTTKY BARRIER PLASMA THYRISTOR CIRCUIT

[75] Inventor: Surinder Krishna, Balston Lake, N.Y.

[73] Assignee: Westinghouse Electric Corporation, Pittsburgh, Pa.

[22] Filed: Jan. 5, 1973

[21] Appl. No.: 321,409

[52] U.S. Cl. .......... 357/15, 357/57, 357/58, 357/13 307/317 A, 331/107 R

[51] Int. Cl. .......... H01l 9/00

[58] Field of Search .. 317/235 VA, 235 K, 235 AD, 317/235 T; 307/317 A; 331/107 R

[56] References Cited

UNITED STATES PATENTS

| | | | |
|---|---|---|---|
| 3,599,323 | 8/1971 | Saxena | 29/59 U |
| 3,673,514 | 6/1972 | Coleman et al. | 331/107 R |
| 3,743,967 | 7/1973 | Fitzsimmons | 331/107 R |

OTHER PUBLICATIONS

Evans et al, Proceed. of the IEEE, Aug. 1970 pp. 1,294–1,295.

Rodgers et al., Electronics Letters, 14 Jan. 1971 Vol. 7, No. 1, page 21.

*Primary Examiner*—Martin H. Edlow
*Attorney, Agent, or Firm*—C. L. Menzemer

[57] ABSTRACT

A plasma thyristor is provided for faster recycling of the plasma mode and sharper output signals. A silicon semiconductor body has a low impurity concentration preferably below $5 \times 10^{14}$ atoms/cm$^3$, has first and second opposed major surfaces, and preferably has a width of greater than about 80 microns. A first Schottky barrier contact is made at the first major surface. A second Schottky barrier or ohmic contact is made at the second major surface. Power sources apply (i) a reverse bias voltage across the first Schottky barrier contact between the contacts causing the carrier depletion field to extend from the first Schottky barrier contact the width of the body to the second contact, and (ii) a current pulse across the body between the contacts having a density greater than the saturation current density of the body. Preferably, the plasma thyristor is used to generate high power, fast rise-time electrical signals.

10 Claims, 5 Drawing Figures

SCHOTTKY BARRIER PLASMA THYRISTOR CIRCUIT

FIELD OF THE INVENTION

The present invention relates to thyristors and particularly thyristors with rast rise-time, high power capacity.

BACKGROUND OF THE INVENTION

Nonlinear, solid state devices that are bistable, that is have a high and low impedance state, are commonly referred to as thyristors, Thyristors may be switched from one impedance state to the other by means of a control signal. Unijunction transistors (i.e., P+NN+ and P+PN+ diodes) and PNPN diodes are common thyristors. Thyristors are not generally useful, however, where fast switching and high power pulses are required. They are known for their relatively long turn-on times (time required to reach peak voltage) and their even longer turn-off time (time required for the base region to be depleted of stored charge).

Unijunction transistors have been made to operate in an avalanche, "trapped plasma" mode, see "A Theory For The High-Efficiency Mode of Oscillation In Avalanche Diode," by Clorfiene, et al., RCA Review (September, 1969), p. 397; and U.S. Pat. No. 3,612,914 and references there cited. The "trapped plasma" has been obtained by providing a relatively highly doped (about $1 \times 10^{15}$ to $1 \times 10^{16}$ atoms/cm$^3$) and narrow width (about 10 micron) base region. These devices provide highly efficient, high "Q" microwave oscillators (e.g., 700–800 M Hz), high speed switches and short duration pulse generators.

The operation of unijunction transistors in the avalanche, "trapped plasma" mode to generate high power, ultra-short duration electrical signals has also been described in co-pending application Ser. No. 354,580 filed Apr. 26, 1973, and assigned to the same assignee as the present invention.

The problem with these devices has been the relatively long recycling time in the output signal. The recycling time has been a high "Q" response corresponding to the fundamental frequency of the device, which in turn corresponds to the plasma extraction time of the device. Moreover, the output signal has been distorted by the capacitance encountered in extraction of the plasma and re-establishing the high impedance state.

The present invention overcomes these disadvantages and difficulties, and provides a fast rise-time, preferably high power thyristor that has a shorter recycling time than previous devices and has a better shaped output signal. Moreover, it make fabrication of plasma thyristors simpler and less expensive. No PN junction is needed. The rectifying junction may be formed simultaneously with the electrical contacts to the semiconductor body.

SUMMARY OF THE INVENTION

A plasma thyristor is provided with a very sharp output signal without trailing edge distortions which can be recycled to the plasma mode more rapidly. Very high rates of change of voltage (dv/dt) and current (di/dt) are thus provided more rapidly with less power loss than with comparable junction plasma thyristors.

Generally, a semiconductor body of greater than 80 microns in width is provided having a low impurity concentration (i.e., between about $1 \times 10^{13}$ and $1 \times 10^{16}$ atoms/cm$^3$) preferably less than $5 \times 10^{14}$ atoms/cm$^3$ and having opposed major surfaces. A Schottky barrier contact is provided at the first major surface. A Schottky barrier or ohmic contact is provided at the second major surface.

A dc bias power source is electrically connected to the contacts. A reverse bias voltage is thus provided across the first Schottky barrier contact that causes the carrier depletion field to extend from the first contact the width of the body to the second contact. A control-power source is also electrically connected to the contacts. A current pulse is thus inputted through the body causing ionization of electron-hole pairs within the body. That is, the input is sufficient to produce a current having a density greater than the saturation current density (Jc). $Jc = q\, n_d\, v_s$; where $q$ is the electron charge constant, $n_d$ is the impurity concentration through the semiconductor body, and $v_s$ is the saturation velocity of either N or P-type carriers in the body.

Preferably, to vary the width of the region in the plasma mode, the semiconductor body has first and second impurity regions of the same conductivity type. The first impurity region adjoins the first major surface and has a low impurity concentration corresponding to the active plasma region. The second impurity region adjoins the second major surface and extends into the body to adjoin the first impurity region. The second impurity region has a high impurity concentration (i.e., $1 \times 10^{17}$ to $1 \times 10^{21}$ atoms/cm$^3$) to provide good ohmic contact to the first impurity region. In this way, the width of first impurity region can be regulated to the desired frequency for the thyristor without reducing the width of the semiconductor body and impeding quality control during production.

Other details, objects and advantages of the invention will become apparent as the following description of the present preferred embodiments and the present preferred methods of practicing the same proceeds.

BRIEF DESCRIPTION OF THE DRAWINGS

In the accompanying drawings is shown present preferred embodiments of the invention and is illustrated present preferred methods of practicing the same in which.

Figure 1:
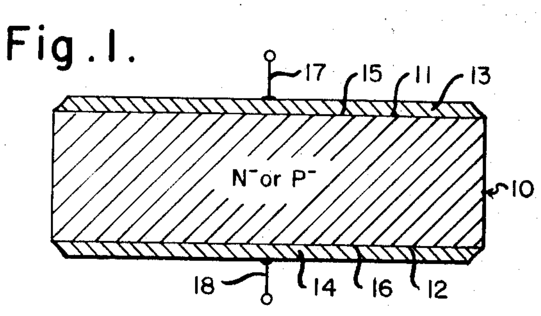
FIG. 1 is an elevation view in cross-section of a silicon semiconductor body assembly suitable for use in making a Schottky barrier plasma thyristor.

2, and of a corresponding PN junction plasma thyristor in the same circuit network.

BRIEF DESCRIPTION OF THE PREFERRED EMBODIMENTS

Referring to the drawings, a thyristor is provided with a silicon semiconductor wafer or body 10 having first and second opposed major surfaces 11 and 12. The body has a low impurity concentration therethrough of, for example, $1 \times 10^{14}$ atoms per cubic centimeter, and a width of greater than 80 microns and preferably greater than 150 microns.

Affixed to surfaces 11 and 12 are first and second metal contacts 13 and 14 to make Schottky barrier contact 15 to surface 11 and Schottky barrier or ohmic contact 16 to surface 12. The Schottky barrier contacts are preferably made by polishing or etching the surfaces to remove imperfection produced in cutting the body 10 from the original ingot. Otherwise, the very short minority carrier lifetime in the surface region of the semiconductor body precludes rectifying action. After polishing or etching, a metal is deposited on the surface by standard methods of evaporation, sputtering or equivalent. The metal used is chosen so that its thermionic work funciion is greater than the work function of the silicon semiconductor body where the body is doped with N-type impurities, or its thermionic work function is less than the work function of the silicon semiconductor body where the body is doped with P-type impurities. Some metals suitable for formation of Schottky barrier contacts with silicon are platinum, chromium-gold alloy, chromium, molybdenum-gold alloy or titanium.

Contact 16 may be either a Schottky barrier or ohmic contact. Preferably it is a Schottky barrier to facilitate manufacture because contacts 15 and 16 can thus be formed simultaneously. It may be a Schottky barrier because in use the barrier is forward biased and its capacitive reactance will cause an RF short circuit. However, if contact 16 is a separately formed ohmic contact, it can be formed by simple vapor deposition of a metal such as molybdenum, aluminum, gold, silver, tantalum or a base alloy.

In any event, electrical leads 17 and 18 are then attached to contacts 13 and 14 by secondary solder contacts or the like. DC bias-power source 21 is then electrically connected by leads 17 and 18 to contacts 13 and 14 to reverse bias the Schottky barrier contact 15. Note that this requires contact 13 to be negative with respect to the body 10 where the body is N-type doped and positive with respect to the body where the body is P-type doped. In either circumstance, the bias-power source 21 establishes a reverse bias sufficient to cause the carrier depletion field in body 10 to extend from the Schottky barrier contact 15 the width of the body to the contact 16.

Control-power source 22 is also connected through a transformer 23 to the body 10 via leads 19 and 20. Control-power source 22 is preferably in series with bias-power source 21. A high current, short duration square wave electrical signal in the form 24 can thereby be inputted to the body 10. The electrical signal has a density greater than the saturation current density of the body. Preferably, the input provided by control power source 22 is greater then 1.5 times the saturation current density for best performance. Current densities between 1.0 and 1.5 times the saturation current density have been found not to provide sufficiently large plasma density for good performance characteristics.

Load 25, e.g., a radar antenna, is also connected to the thyristor through leads 19 and 20. The load is connected in series (as shown) with the body 10 and power source 22 where a high voltage-high power output to the load is desired. On the other hand, the load may be connected in parallel with the body 10 and the power source 22 (not shown) where high current-high power output to the load is desired.

Also connected into the circuit between the body 10 and the load 25 is DC blocking network 26, low pass filter 27, and band pass filter 28. DC blocking network 26 stops the passage of the dc bias from bias-power source 21 to the load 25. Low pass filter 27 blocks from the load 25 all ac signals with a frequency greater than the fundamental frequency ($f_1$) of the output from body 10. $f_1 = v_s/4\pi W_B$, where $v_s$ is the saturation velocity of carriers and $W_B$ is the width of body 10 or the active plasma region thereof. Low pass filter 27 thus blocks the passage of the input to body 10 from the load 25. And band pass filter 28 eliminates the low frequency noise from reaching the load 25.

Also in the circuit between the body 10 and the load 25 is matching network 29 to provide for maximum power flow or transfer from the thyristor 10 to the load 25. Matching network 29 comprises components of inductance and capacitance to match the impedances of the thyristor and load at the frequency of interest which is usually the fundamental or lower harmonic frequencies of the thyristor. Preferably the matching network 29 is a high "Q" circuit tuned to the frequency of interest for optimum efficiency.

As stated above, the frequency of the thyristor is dependent on the width of the active plasma region of the body 10. The width also sets the recycling time of the device. The width of the active plasma region may correspond to the width of the body as shown in FIG. 1. However, body 10 is generally 150 to 200 microns (or greater) in width to provide the handling requirements during production. Semiconductor wafers of less than 150 microns are available and have been used, but the percent of rejections of such devices during production is correspondingly high. No problem is presented where the thyristor is used to generate high power, short duration electrical signals because widths of greater then 150 microns are needed. But where the width desired is smaller problems are encountered.

Figure 3:
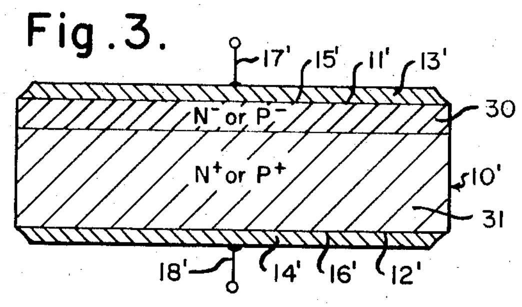
FIG. 3 is an elevation view in cross-section of an alternative silicon semiconductor body assembly suitable for use in making a Schottky barrier plasma thyristor.
Figure 2:
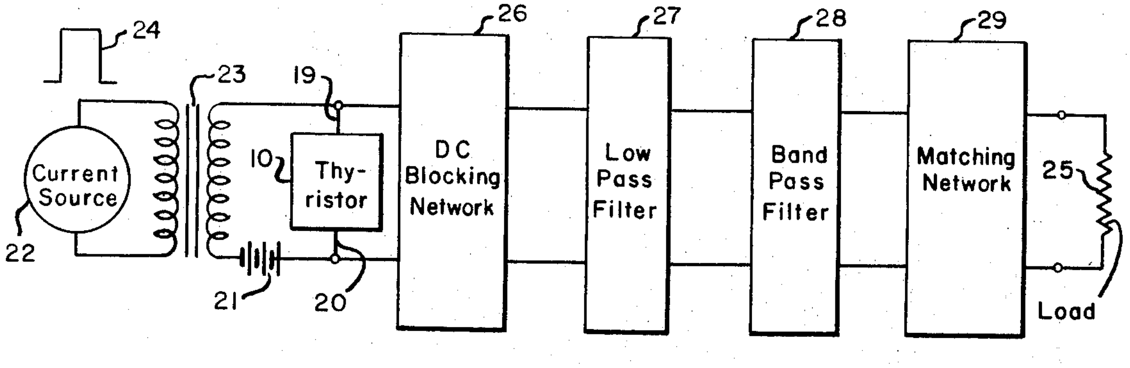
FIG. 2 is a schematic drawing showing a Schottky barrier plasma thyristor adapted in a circuit network.

To resolve the difficulty, a semiconductor body 10' having two impurity regions is provided as shown in FIG. 3. The semiconductor body assembly of FIG. 3 has all the features of the assembly shown in FIG. 1 as above described, except that it has two impurity regions 30 and 31. Impurity region 30 adjoins surface 11' and has the low impurity concentration corresponding to the active plasma region. Impurity region 31 adjoins surface 12' and extends into body 10' to adjoin region 30. Region 31 has a high impurity concentration therethrough, e.g., $1 \times 10^{19}$ atoms/cm$^3$, of the same semiconductivity as region 30 to provide good ohmic contact to region 30. Region 31 is preferably formed either during epitaxial growth of the semiconductor ingot or by standard diffusion techniques of body 10. In this way, the width of the active plasma region (i.e., region 30) can be reduced to as little as 1 micron, e.g., where a microwave oscillator is desired, without impeding the quality control in production.

In operation, body 10 is biased by dc power source 22 to a voltage above the punch-through voltage of the active region of the body 10. That is, a voltage sufficiently high that the carrier depletion field extends from the Schottky barrier contact 15 or 15' across the width of the body 10 or impurity region 30 to the second contact or the second impurity region 31. A low voltage, high power pulse is then applied from control-power source 22 causing a current having a density above the saturation current density to be inputted to body 10 or 10'. The electric field thus produced propagates through the body 10 or the impurity region 31 at a much higher velocity than the velocity of the carriers (i.e., electrons and holes). A high density of ionized electron-holes pairs is hence left in the wake of the electric field as a "trapped plasma." In the presence of this plasma, the applied bias field collapses to a low value and the body 10 or 10' is in a low impedance, highly conductive mode generating a high energy, short duration pulse which is transmitted to load 25 as either a high voltage or a high current-high power signal.

Subsequently, the electrons and holes will drift apart to their respective polarities under the influence of the applied bias from dc power source 21. As the plasma density diminishes, the electric field rises again to the external bias voltage so that the field through the body 10 or region 30 resumes the high impedance blocking state. Unlike the junction plasma thyristors, however, the drifting electrons and holes do not remain in the rectifying junction as stored charge. This is because the rectification of the thermionic work function at the Schottky barrier contact is maintained during the collapse of the electric field within the active plasma region. As a result, power dissipation is substantially reduced and distortion of the trailing edge of the output signal due to capacitance of the stored charge in the rectifying junction is eliminated.

Figure 4:
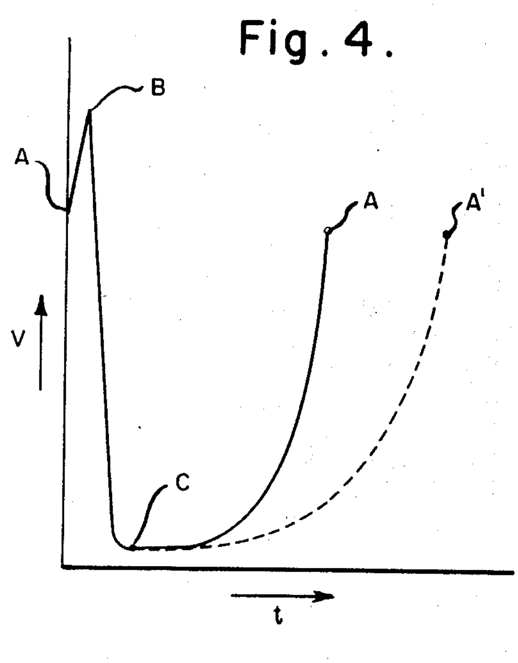
FIG. 4 is a graphic comparative illustration of the voltage output as a function of time of a Schottky barrier plasma thyristor in the circuit network of FIG. 2, and of a corresponding PN junction plasma thyristor in the same circuit network.

To illustrate the operation cycle reference is made to FIG. 4 showing the voltage output from body 10 (or 10'). At point A, the body responds as an equivalent capacitor and the response is equal to the dc bias voltage. When the square-wave input is provided from the control-power source 22, the voltage rises until it reaches the peak voltage at point B. The time required to reach point B is called the "turn-on" time and occurs in the present device in picoseconds. The plasma state is then reached and the electric field collapses; the voltage falls to point C which is about one four-hundredth of the value at point B. At this point, the bidy 10 (or 10') outputs a high power pulse which is transmitted to the load as a high current pulse if the load is in series, or (as shown) as a high voltage pulse if the load is in parallel.

Thereafter, the plasma and residual excess carriers are extracted from the active region (i.e., body 10 or region 30) and the carrier depletion field in body 10 or region 30 reestablished, and the thyristor recharged by the external bias. By these mechanisms, the voltage rebuilds to point A again. The time required to perform this part of the cycle is called the "turn-off" time and greatly exceeds the "turn-on" and plasma state times. This is of no consequence except in recycling because the power generation and/or switching occurs while the device is in the turn-on and plasma modes. However, the recycle time of the Schottky barrier plasma thyristor is substantially faster than the PN junction plasma thyristor as shown by a comparison of the solid line with the dotted line in FIG. 4. The dotted line of FIG. 4 illustrates the recycle time of a corresponding junction plasma thyristor. In this connection it should be noted that the plasma formation and extraction occurs in a much shorter time than the recombination time of the electron-hole pairs in the active plasma region.

Figure 5:
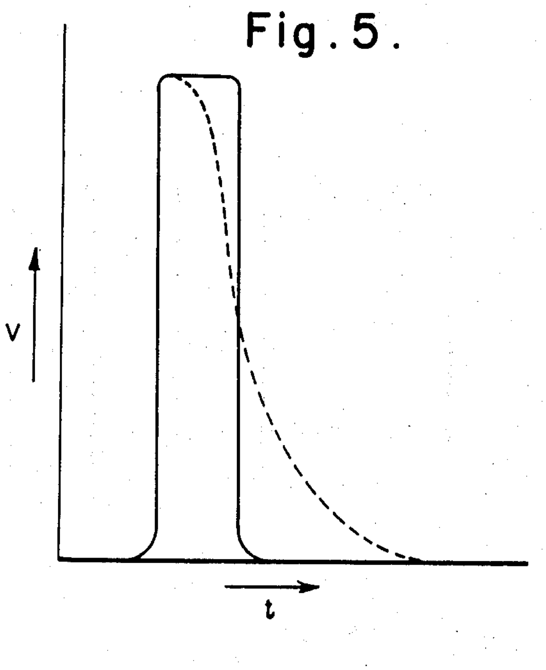
FIG. 5 is a graphic comparative illustration of the output pulse to load as a function of time of a Schottky barrier plasma thyristor in the circuit network of FIG.

To further illustrate the results of the invention FIG. 5 shows the output to load of a typical signal from a Schottky barrier plasma thyristor and a corresponding PN junction barrier plasma thyristor. The output signal is squared off by providing a suitable RC branch in the matching network 29. The solid line demonstrates the Schottky barrier plasma thyristor, and the dotted line demonstrates the PN junction plasma thyristor. As shown, the distortion of the trailing edge of the output signal by the capacitance of the stored charge in the junction are eliminated. Attendant power losses are also avioded and the efficiency of the system is correspondingly increased.

While the presently preferred embodiments of the invention have been specifically described, it is distinctly understood that the invention may be otherwise variously embodied and used within the scope of the following claims.

What is claimed is:

1. A plasma thyristor circuit comprising:

a. a semiconductor body of greater than 80 microns in width having a low impurity concentration therethrough and having opposed major surfaces;

b. separately opposed metal contacts affixed to the major surface of the body to form a Schottky barrier contact at at least one major surface;

c. a bias power source electrically connected to the opposed metal contacts and capable of applying a reverse bias voltage across the body to cause a carrier depletion field to extend from the Schottky barrier contact reverse biased to the opposed metal contact; and d. a current power source electrically connected to the opposed metal contacts and capable of causing a current pulse through the body having a density greater than the saturation current density of the body.

2. A plasma thyristor circuit as set forth in claim 1 wherein: the impurity concentration through the semiconductor body is less than $5 \times 10^{14}$ atoms/cm$^3$.

3. A plasma thyristor circuit as set forth in claim 1 comprising in addition:

e. a matching circuit for processing output signals from the body electrically connected to the electrical contacts and having high "Q" impedance for balancing an impedance of the output signal from the body.

4. A plasma thyristor circuit comprising:

a. a semiconductor body having opposed major surfaces and first and second impurity regions, said first impurity region being of greater than 80 microns in width and having a low impurity concentration therethrough, said second impurity region having a high impurity concentration therethrough, said impurity regions adjoining each other and each adjoining a separate major surface and each other and having the same conductivity type;

b. separate opposed metal contacts affixed to the major surfaces of the body to form a Schottky barrier contact at at least the major surface adjoining the first impurity region;

c. a bias power source electrically connected to the opposed metal contacts and capable of applying a reverse bias voltage across the body to cause a carrier depletion field to extend from the Schottky barrier contact to the second impurity region; and d. a current power source electrically connected to the opposed metal contacts and capable of causing a current pulse through the body having a density greater than the saturation current density of the body.

5. A plasma thyristor circuit as set forth in claim 1 wherein:

the semiconductor body has a width greater than 150 microns.

6. A plasma thyristor circuit as set forth in claim 1 wherein:

the current density of the current supplied by the current power source is more than 1.5 times greater than the saturation current density of the body.

7. A plasma thyristor circuit as set forth in claim 4 wherein:

the width of the first impurity region is greater than 80 microns.

8. A plasma thyristor circuit as set forth in claim 4 wherein:

the impurity concentration through the first impurity region is less than $5 \times 10^{14}$ atoms/cm$^3$.

9. A plasma thyristor circuit as set forth in claim 4 wherein:

the semiconductor body has a width greater than 150 microns.

10. A plasma thyristor circuit as set forth in claim 4 wherein:

the current density of the current supplied by the current power source is more than 1.5 times greater than the saturation current density of the body.

* * * * *

UNITED STATES PATENT AND TRADEMARK OFFICE

Certificate

Patent No. 3,829,880 Patented August 13, 1974

Surinder Krishna

Application having been made by Surinder Krishna, the inventor named in the patent above identified, and Westinghouse Electric Corporation, Pittsburgh, Pa., a corporation of Pennsylvania, the assignee, for the issuance of a certificate under the provisions of Title 35, Section 256, of the United States Code, adding the name of Chang Kwei Chu as a joint inventor, and a showing and proof of facts satisfying the requirements of the said section having been submitted, it is this 15th day of July 1975, certified that the name of the said Chang Kwei Chu is hereby added to the said patent as a joint inventor with the said Surinder Krishna.

FRED W. SHERLING,
*Associate Solicitor.*